United States Patent [19]
Keith et al.

[11] Patent Number: 5,764,548
[45] Date of Patent: Jun. 9, 1998

[54] FAST FLOATING-POINT TO INTEGER CONVERSION

[75] Inventors: Michael Keith, Portland, Oreg.; Robert S. Dreyer, Palo Alto, Calif.

[73] Assignee: Intel Corporation, Santa Clara, Calif.

[21] Appl. No.: 537,260

[22] Filed: Sep. 29, 1995

[51] Int. Cl.⁶ .................... G06F 7/00; G06F 7/38
[52] U.S. Cl. .................... 364/715.03; 364/748.01; 364/769
[58] Field of Search ............ 364/715.01, 715.03, 364/715.04, 715.06, 737, 745, 748, 769

[56] References Cited

U.S. PATENT DOCUMENTS

| | | | |
|---|---|---|---|
| 5,257,215 | 10/1993 | Poon | 364/745 |
| 5,274,708 | 12/1993 | Fields et al. | 381/1 |
| 5,504,697 | 4/1996 | Ishida | 364/745 |
| 5,528,741 | 6/1996 | Lucas | 364/745 X |
| 5,561,615 | 10/1996 | Kuo et al. | 364/715.03 |

*Primary Examiner*—Chuong Dinh Ngo
*Attorney, Agent, or Firm*—N. Stephan Kinsella, Esq.; William H. Murray, Esq.

[57] ABSTRACT

Input signals in floating-point format are converted into output signals in integer format while handling saturation cases appropriately. Saturation exists when the value of an input signal is outside the output range. Saturation cases are detected by invoking an integer comparison instruction using signals in floating-point format as inputs to the integer comparison instruction. When implemented in software on processors such as the Intel® Pentium™ processor, using an integer comparison instruction to compare signals in floating-point format provides more efficient signal conversion than conventional schemes that use a floating-point comparison instruction to compare floating-point signals.

21 Claims, 4 Drawing Sheets

FAST FLOATING-POINT TO INTEGER CONVERSION

BACKGROUND OF THE INVENTION

1. Field of the Invention

The present invention is related to computer-based signal processing and, in particular, to the conversion of signals represented in floating-point format into signals represented in integer format.

2. Description of the Related Art

Signal processing, Such as audio signal processing, involves computational loads that may be too great for earlier versions of general-purpose processors to handle in software in an efficient manner. As a result, such signal processing has traditionally been off-loaded from the general-purpose host processor to be performed in hardware on special-purpose digital signal processing (DSP) chips. As general-purpose processors have become faster and faster over time, more and more processing that was previously off-loaded onto special-purpose processors like DSPs is beginning to be performed in software on general-purpose host processors.

In some situations, signal processing being implemented in software on general-purpose processors is performed on signals represented in floating-point format. A floating-point value F may be represented algebraically according to Equation (1) as follows:

$$F = S \cdot 2^N \cdot X \quad (1)$$

where S is the sign (+1 or −1), N is the exponent, and X is the mantissa. According to an IEEE (Institute of Electrical and Electronics Engineers) standard, the sign S is represented by a 1-bit value (s), where (s=0) for a positive value (i.e., S=1), and (s=1) for a negative value (i.e., S=−1). The exponent N (which has a value between −126 and +127) is represented by an 8-bit binary value (nnnnnnnn), where this value is equal to N+127 (i.e., it is biased so that it is always positive). The mantissa X is represented by an 23-bit binary value (xxxxxxxx xxxxxxxx xxxxxxx), where the most significant bit (MSB) is the left-most bit and has a value of 0.5, the second MSB is the bit to the right of the MSB and has a value of 0.25, etc. Under the IEEE standard, signal F is represented in floating-point format according to Equation (2) as follows:

$$F = (snnnnnnnnxxxxxxxxxxxxxxxxxxxxxxx) \quad (2)$$

where s is the MSB.

In some situations, after the signal processing in floating-point format has been completed, the resulting signal data needs to be converted from floating-point form at to integer format (i.e., twos-complement format) for further processing. For example, in some audio signal processing applications, each set of audio signals (i.e., each audio frame) is to be processed in software on a general-purpose host processor in floating-point format. This floating-point processing may include, for example, such operations as speech coding, echo cancellation, compression, decompression, and/or recognition. After the floating-point software-based audio processing is complete, tile audio signals need to be converted from floating-point format to integer format for transmission to audio hardware for further processing (e.g., for digital-to-analog conversion and rendering).

Standard audio sampling rates are 8K, 11K, and 22K samples per second. If the amount of time required to convert these large numbers of audio signals from floating-point format to integer format is too great and/or if the percentage of the processor's processing power devoted to that conversion is too high, then such software-based audio processing on a general-purpose processor may be impractical, if not impossible, especially in real-time applications. It is desirable, therefore, in these applications to perform the conversion of audio signals from floating-point format to integer format as efficiently as possible.

As such, it is a purpose of the present invention to provide efficient conversion of signals, such as audio signals, from floating-point format to integer format.

Further objects and advantages of this invention will become apparent from the detailed description of a preferred embodiment which follows.

SUMMARY OF THE INVENTION

The present invention comprises computer-implemented processes, apparatuses, and storage mediums encoded with machine-readable computer program code for processing signals using a processor. According to a preferred embodiment, an input signal is provided in floating-point format. The input signal in floating-point format is converted into an output signal in integer format, wherein the conversion comprises the step of invoking an integer comparison instruction of the processor using a first signal in floating-point format and a second signal in floating-point format as inputs to the integer comparison instruction.

BRIEF DESCRIPTION OF THE DRAWINGS

Other objects, features, and advantages of the present invention will become more fully apparent from the following detailed description of the preferred embodiment, the appended claims, and the accompanying drawings in which:

DESCRIPTION OF THE PREFERRED EMBODIMENT(S)

Figure 1:
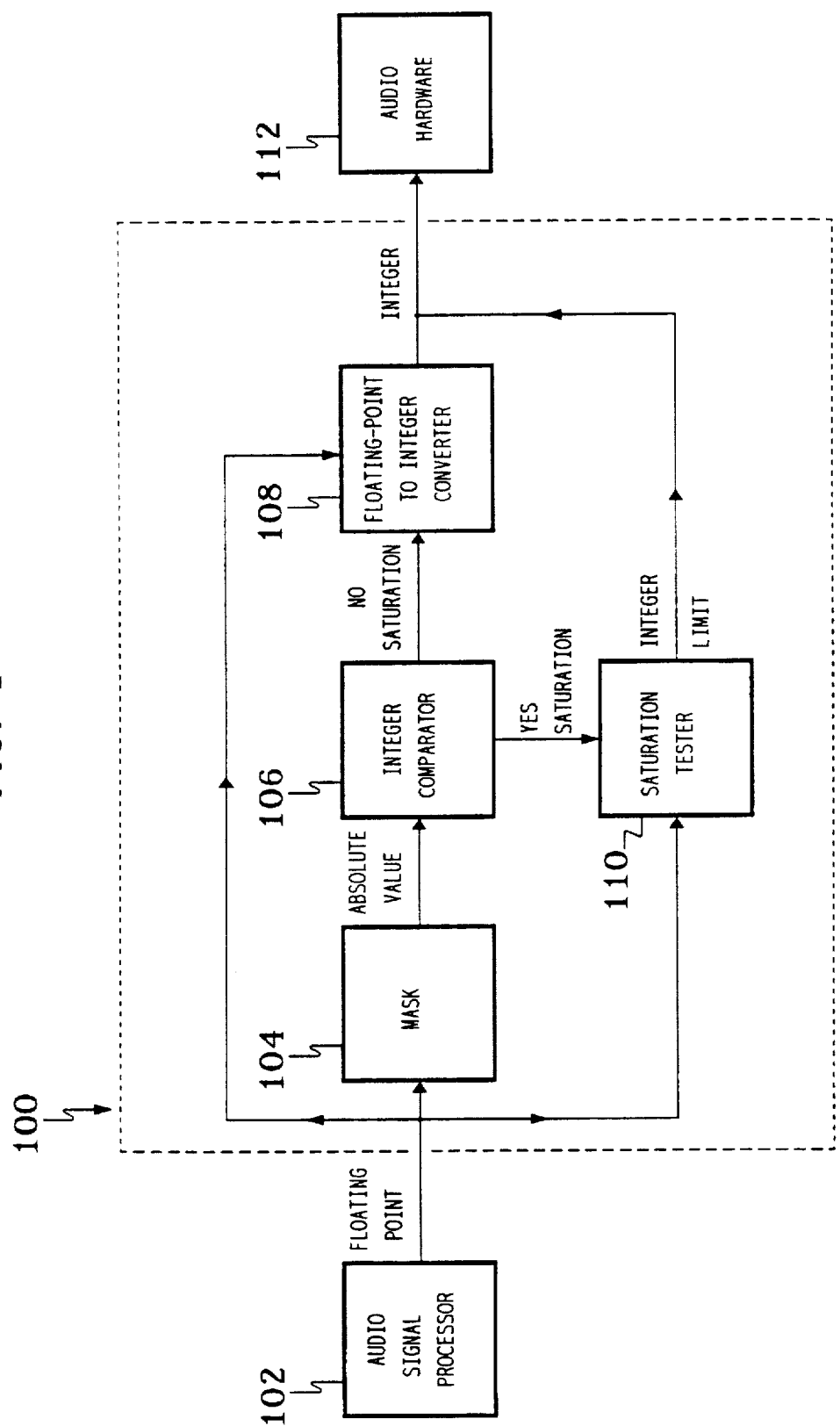
FIGS. 1 and 2, are, respectively, a block diagram of a signal conversion system 100 for converting audio input signals in 32-bit floating-point format into audio output signals in 16-bit integer format and a flow diagram of the processing performed by system 100, according to a preferred embodiment of the present invention.

The present invention is directed to convertors that receive input signals in floating-point format and convert those floating-point input signals into output signals in integer format. In certain general-purpose processors, there are predefined software instructions for converting signals in floating-point format into signals in integer format. It may be, however, that these software instructions do not appropriately handle saturation conditions in which the floating-point input signals have values that are outside of the limits of the integer output signals. If some of the floating-point input signals are outside of the integer output limits and if the predefined software instructions do not return appropriate output signals for those inputs, then the resulting integer output signals may be unacceptable. For example, in audio signal processing, if the input signal is too high (i.e., greater than an output upper limit) and if the predefined floating-point-to-integer conversion instruction returns a value that is too low, then the quality of the resulting rendered audio may be adversely affected.

As an example, assume that the input signals are 32-bit floating-point signals represented as shown in Equation (2) above. Assume further, that the output signals need to be 16-bit integer signals. According to Equations (1) and (2), then, the input signals range from about $-2^{127}$ to about $+2^{127}$, while the 16-bit integer output signals range from $-2^{15}$ or $-32,768$ to $+2^{15}-1$ or $+32,767$. One way to insure that input signals that are outside the output range are handled properly is to compare the input signals to the output limits and then perform special processing for those cases in which the inputs are outside the output range. Such processing may be represented as follows:

if input>+32,767, then apply saturated-high processing
elseif input<−32,768, then apply saturated-low processing
else apply predefined conversion instruction
where:

The "saturated-high processing" returns the appropriate output signal in integer format when the floating-point input signal is greater than the output upper limit of +32,767. In this case, the appropriate output signal may be a constant (e.g., the upper limit +32,767) in integer format. The "saturated-low processing" returns the appropriate output signal in integer format when the floating-point input signal is less than the output lower limit of −32,768. In this case, the appropriate output signal may be a constant (e.g., the lower limit −32,767) in integer format.

The "predefined conversion instruction" returns the appropriate output signal in integer format when the floating-point input signal is within the output range. In this case, the appropriate output signal will have (approximately) the same value as the input signal, but expressed in integer format.

For input signals that are either too high or too low, the appropriate output signals need not be constants equal to the positive or negative output limits. In general, the appropriate output signals may be functions of the input signals that may depend upon the particular application.

In Intel® Pentium™ processors, there is a predefinied floating-point integer store (FIST) instruction that converts 32-bit signals in floating-point format into 16-bit signals in integer format. There is also a predefined floating-point comparison (FCOM) instruction that compares a first floating-point signal to a second floating-point signal. Using these instructions, the conversion of floating-point signals into integer signals while properly handling saturation conditions may be implemented as follows:

if (F>C1), then output D1
elseif (F<C2), then output D2
else FIST (F)
where:

F=the input signal in floating-point format,
C1=the positive output limit (i.e., +32,767) in floating-point format,
D1=the positive output limit (i.e., +32,767) in integer format,
C2=the negative output limit (i.e., −32,768) in floating-point format, and
D2=the negative output limit (i.e., −32,768) in integer format.

When the input signal F is within the output range, an Intel® Pentium™ processor will implement the above processing in about 30 cycles. Since, in typical audio processing, the vast majority of input signals will be within the output range, the above processing will take, on the average, just under 30 cycles for each conversion. This can be prohibitively long when processing the large numbers of audio signals per second that need to be converted from floating-point format into integer format for standard audio sampling rates. Those skilled in the art will understand that, in alternative embodiments of the processing described above (and in the rest of this specification), "less than or equal to" and "greater than or equal to" comparison operations may be used instead of "less than" and "greater than" operations with appropriate changes to the constants C1 and C2.

Figure 2:
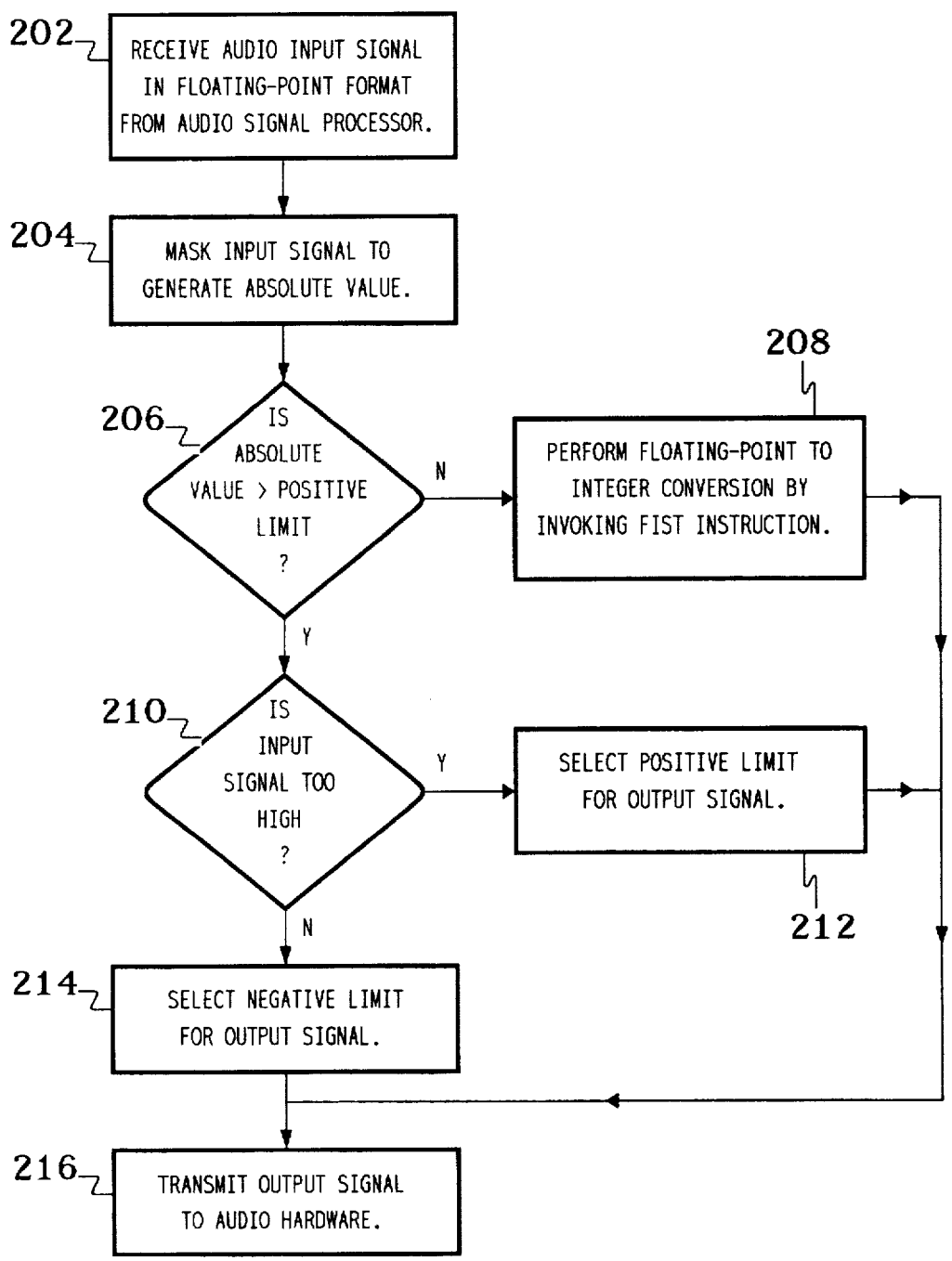

Referring now to FIGS. 1 and 2, there are shown, respectively, a block diagram of a signal conversion system 100 for converting audio input signals in 32-bit floating-point format into audio output signals in 16-bit integer format and a flow diagram of the processing performed by system 100, according to a preferred embodiment of the present invention. In the embodiment shown in FIGS. 1 and 2, both the audio signal processor 102 and the signal conversion system 100 are implemented in software on an Intel® Pentium™ processor.

Audio input signals in the 32-bit floating-point format shown in Equation (2) are received by system 100 from audio signal processor 102 (step 202 of FIG. 2). Mask 104 of system 100 generates the absolute values of the input signals by masking off the MSBs (i.e., the sign bits) (step 204). In a preferred embodiment, this is done by ANDing each 32-bit input signal with the 32-bit binary value (0111 . . . 111) to generate a 32-bit masked signal. In alternative embodiments, other methods of generating the absolute values of the input signals may be performed.

Integer comparator 106 compares the masked signal in floating-point format with a specified constant representing the positive output limit to determine whether the 32-bit masked signal is too high (step 206). The specified constant is equivalent to +32,767 represented in floating-point format, but the function called by comparator 106 is the predefined Intel® Pentium™ processor integer comparison instruction CMP and not the floating-point comparison instruction FCOM. That is, even though the instruction CMP is an integer function that is designed to compare two 32-bit integer signals, the inputs to CMP in step 206 are in floating-point format. Although the CMP instruction treats the two 32-bit floating-point inputs as if they were in integer format, nevertheless, an accurate comparison is performed. As explained in the next paragraph, this is due to the particular manner in which signals are represented in floating-point format, as shown in Equation (2).

In general, according to Equations (1) and (2), if the exponent of a first positive floating-point signal is larger than the exponent of a second positive floating-point signal, then the first signal will be larger than the second signal, no matter what the mantissas are. If the exponents of two positive floating-point signals are the same, then the signal with the larger mantissa will be the larger of the two signals. Because of the particular bit representation of floating-point signals of Equation (2), as long as the signals are positive, larger floating-point signals will also be the larger signals when those same bits are interpreted as if the signals were in integer format. This is why applying the integer CMP instruction to the two positive floating-point signals in step 206 yields the correct comparison result.

If the masked signal generated by mask 104 is not greater than the specified constant (step 206), then there is no saturation. In that case, floating-point-to-integer converter 108 converts the original input signal in floating-point format to the output signal in 16-bit integer format (step 208). In a preferred embodiment, this is performed by calling the Intel® Pentium™ processor FIST instruction. In alternative embodiments, this can be performed by invoking any processor instruction that stores a floating-point number in 16-bit integer format. Note that this instruction does not need to have any saturation logic, since the previous steps in this procedure guarantee that the value being converted to 16-bit integer format is within the range −32,768 to +32,767. The output signal in integer format is then transmitted to audio hardware 112 for further processing (step 216).

If, however, the masked signal is greater than the specified constant (step 206), then there is saturation. In that case, saturation tester 110 determines whether the original input signal in floating-point format is too high or low (step 210). In a preferred embodiment, saturation tester 110 tests the sign bit of the original floating-point number to determine if it is positive or negative (and therefore whether the original input signal is too high or too low). If the original input signal is too high (step 210), then the positive output limit (i.e., +32,767) in integer format is selected as the output signal (step 212). Otherwise, the original input signal is too low and the negative output limit (i.e., −32,768) in integer format is selected as the output signal (step 214). In either case, the selected output signal in integer format is transmitted to audio hardware 112 (step 216).

The processing of system 100 of FIGS. 1 and 2 may be implemented on Intel® Pentium™ processors using the following processing:

T=mask(F,M)
if(T>C1), then
    if F is positive, then output D1
    else output D2
else FIST (F)
where:
    F=the original input signal in floating-point format,
    M=the 32-bit mask constant (0111 . . . 111),
    T=the masked input signal in floating-point format,
    C1=the positive output limit (i.e., +32,767) in floating-point format,
    C2=a constant less than +32,768 (e.g., 0) in floating-point format,
    D1=the positive output limit (i.e., +32,767) in integer format, and
    D2=the negative output limit (i.e., −32,768) in integer format.

In Intel® Pentium™ processors, the integer comparison instruction CMP is (about 9 times) faster than then the floatin(g-point comparison instruction FCOM. Moreover, in normal situations in which the input signal is within the output range, only one comparison instruction needs to be performed. Thus, where the conventional scheme requires about 30 cycles on Intel® Pentium™ processors, the scheme of FIGS. 1 and 2 requires only about 12 cycles on Intel® Pentium™ processors in the typical situation in which there is no saturation. When there is saturation, the processing is more involved, but it is still faster than the conventional scheme.

Figure 3:
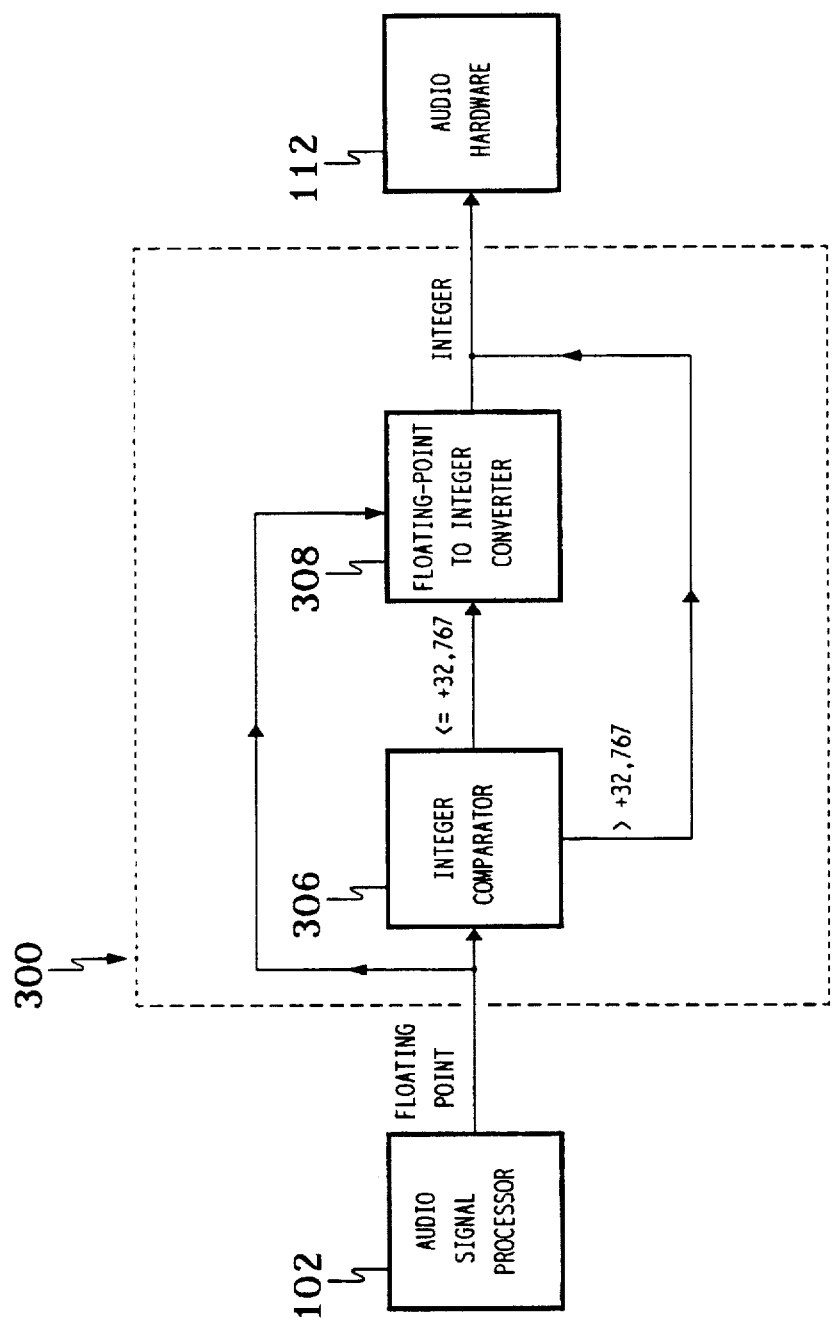
FIGS. 3 and 4, there are shown, respectively, a block diagram of a signal conversion system 300 for converting audio input signals in 32-bit floating-point format into audio output signals in 16-bit integer format and a flow diagram of the processing performed by system 300, according to an alternative preferred embodiment of the present invention.
Figure 4:
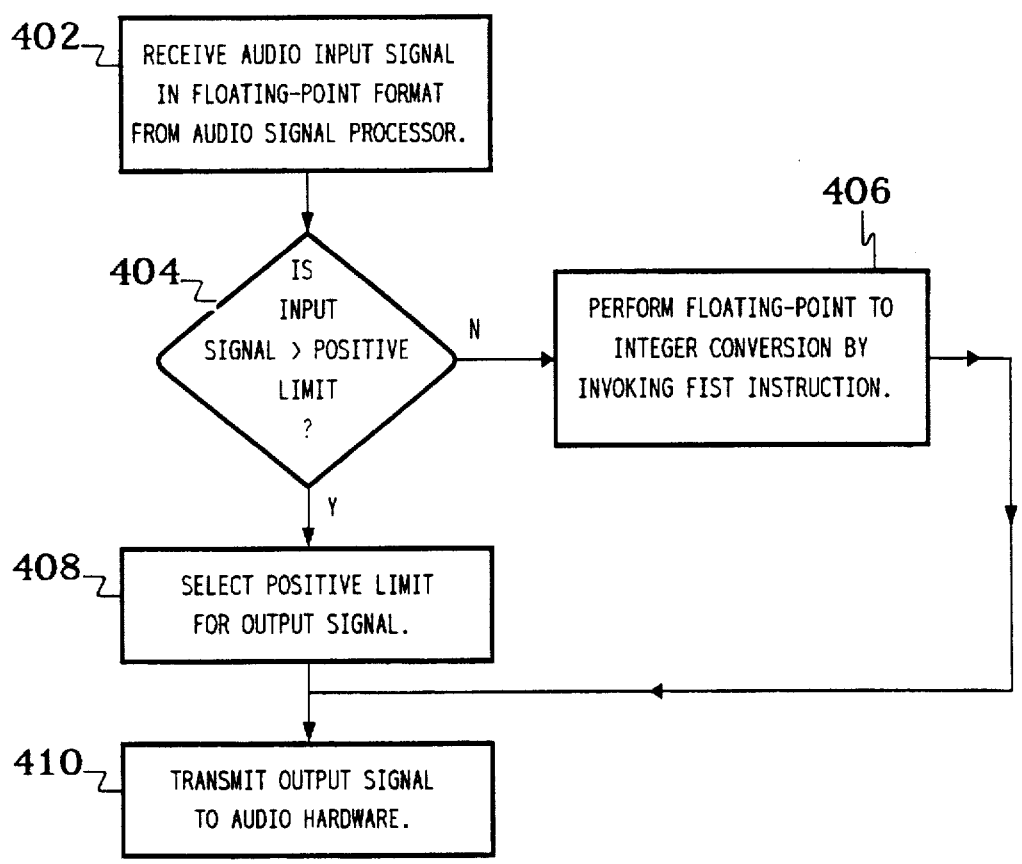

Referring now to FIGS. 3 and 4, there are shown, respectively, a block diagram of a signal conversion system 300 for converting audio input signals in 32-bit floating-point format into audio output signals in 16-bit integer format and a flow diagram of the processing performed by system 300, according to an alternative preferred embodiment of the present invention. In the embodiment shown in FIGS. 3 and 4, both the audio signal processor 102 and the signal conversion system 300 are implemented in software on an Intel® Pentium™ processor.

For input signals less than −32,768, the predefined FIST instruction returns the negative output limit (−32,768) in integer format. For input signals greater than +32,767, the predefined FIST instruction also returns the negative output limit (−32,768) in integer format, and not the positive limit (+32,767). The scheme of FIGS. 3 and 4 exploits these characteristics of tile FIST instruction.

As was the case with system 100 of FIGS. 1 and 2, input signals in 32-bit floating-point format are received by system 300 from audio signal processor 102 (step 402 of FIG. 4). Integer comparator 306 compares each 32-bit input signal in floating-point format with a specified constant representing tile positive output limit (i.e., +32,767) to determine whether the 32-bit input signal is too high (step 404). The specified constant is represented in floating-point format, but tile function called by comparator 306 is the Intel® Pentium™ processor integer comparison instruction CMP. The use of the integer comparison instruction CMP to compare two floating-point numbers works in a similar way as described for the preferred embodiment of system 100.

If the input signal is not greater than the positive output limit (step 404), then there is no saturation high. In that case, floating-point-to-integer converter 308 converts the input signal in floating-point format to the equivalent output signal in 16-bit integer format using the Intel® Pentium™ processor FIST instruction (step 406). As described earlier, the FIST instruction returns an appropriate output signal for all input signals less then or equal to the positive output limit of +32,767. The output signal in integer format is then transmitted to audio hardware 112 for further processing (step 410).

If, however, the input signal is greater than the positive output limit (step 404), then there is saturation high. In that case, the positive limit (i.e., +32,767) in integer format is selected as the output signal (step 408). The selected output signal in integer format is then transmitted to audio hardware 112 (step 410).

The processing, of system 300 of FIGS. 3 and 4 may be implemented on Intel® Pentium™ processors using the following processing:

if (F>C1), then output D1
else FIST (F)
where:
    F=the original input signal in floating-point format,
    C1=the positive output limit (i.e., +32,767) in floating-point format, and
    D1=the positive output limit (i.e., +32,767) in integer format.

On Intel® Pentium™ processors, the scheme of FIGS. 3 and 4 requires only about 11 cycles for each input signal in the typical situation in which there is no saturation high, thus providing even faster floating-point-to-integer conversion than the scheme of FIGS. 1 and 2. When there is saturation high, processing is even faster because the FIST instruction is skipped.

In an alternative preferred embodiment, the present invention may be implemented using the following processing:

X=FIST (F)
if (F>C1), then X=D1
Output X
where X, FIST, F, C1, and D1 are as defined for FIGS. 3 and 4 and where, as before, the ">" operation is implemented using the integer comparison instruction CMP.

In a preferred embodiment, the present invention is used to convert 32-bit floating-point signals into 16-bit integer signals. Those skilled in the art will understand that, under alternative embodiments of the present invention, floating-point signals of sizes other than 32 bits may be converted into integer signals of sizes other than 16 bits. For example, 64-bit floating-point signals may be converted into 32-bit integer signals; 32-bit floating-point signals may be converted into 32-bit integer signals; 64-bit floating-point signals may be converted into 16-bit integer signals; and 80-bit floating-point signals may be converted into integer signals of different sizes.

Those skilled in the art will understand that the claimed invention covers the floating-point-to-integer conversion of signals other than audio signals. The claimed invention is particularly useful in reducing processing loads when large numbers of signals are to be converted from floating-point format to integer format in short periods of time in software on general-purpose processors that do not have predefined instructions that properly handle saturation (i.e., overflow) conditions.

In a preferred embodiment, the claimed invention is implemented in software on an Intel® Pentium™ processor. In alternative embodiments, the claimed invention may be implemented in software on other general-purpose processors that do not have predefined functions that appropriately handle all saturation conditions. The claimed invention may also be implemented on special-purpose processors that do not have predefined functions that appropriately handle all saturation conditions.

The present invention can be embodied in the form of computer-implemented processes and apparatuses for practicing those processes. The present invention can also be embodied in the form of computer program code embodied in tangible media, such as floppy diskettes, CD-ROMs, hard drives, or any other computer-readable storage medium, wherein, when the computer program code is loaded into and executed by a computer, the computer becomes an apparatus for practicing the invention. The present invention can also be embodied in the form of computer program code, for example, whether stored in a storage medium, loaded into and/or executed by a computer, or transmitted over some transmission medium, such as over electrical wiring or cabling, through fiber optics, or via electromagnetic radiation, wherein, when the computer program code is loaded into and executed by a computer, the computer becomes an apparatus for practicing the invention.

It will be further understood that various changes in the details, materials, and arrangements of the parts which have been described and illustrated in order to explain the nature of this invention may be made by those skilled in the art without departing from the principle and scope of the invention as expressed in the following claims.

What is claimed is:

1. A computer-implemented process for transforming an audio input signal using a processor of the computer, comprising the steps of:

(a) providing a floating-point format input signal corresponding to the audio input signal;

(b) processing the input signal to provide a processed input signal;

(c) converting the processed input signal into an into an integer format output signal, wherein step (c) comprises the step of invoking an integer comparison instruction of the processor to determine whether the processed input signal is larger than a second floating-point format signal which is used as an input to the integer comparison instruction; and (d) transforming the integer format output signal into an analog audio output signal.

2. The process of claim 1, wherein the processed input signal is used as another input to the integer comparison instruction and the second signal is a first constant in floating-point format, wherein step (c) comprises the steps of:

(1) returning a second constant in integer format, if the processed input signal is larger than the first constant; and (2) invoking a floating-point-to-integer conversion instruction of the processor using the processed input signal as input to the floating-point-to-integer conversion instruction, if the processed input signal is not larger than the first constant.

3. The process of claim 2, wherein:

the processor is an Intel® Pentium™ processor;

the integer comparison instruction is a CMP instruction;

the first constant is +32,767 in floating-point format;

the second constant is +32,767 in integer format; and the floating-point-to-integer-conversion instruction is a FIST instruction.

4. The process of claim 1, wherein step (c) comprises the steps of:

(1) generating the absolute value of the processed input signal in floating-point format;

(2) invoking the integer comparison instruction, wherein a first signal in floating-point format equal to the absolute value of the processed input signal in floating-point format is used as another input to the integer comparison instruction and the second signal is a first constant in floating-point format;

(3) determining whether the processed input signal is too high or too low, if the absolute value of the processed input signal is larger than the first constant;

(4) returning a second constant in integer format, if the processed input signal is too high;

(5) returning a third constant in integer format, if the processed input signal is too low; and (6) invoking a floating-point-to-integer conversion instruction of the processor using the processed input signal as input to the floating-point-to-integer conversion instruction, if the absolute value of the processed input signal is not larger than the first constant.

5. The process of claim 4, wherein:

the processor is an Intel® Pentium™ processor;

step (c)(1) comprises the step of masking the input signal to generate the absolute value of the input signal;

the integer comparison instruction is a CMP instruction;

the first constant is +32,767 in floating-point format;

the second constant is +32,767 in integer format;

the third constant is −32,768 in integer format; and the floating-point-to-integer conversion instruction is a FIST instruction.

6. An apparatus for processing signals using a processor, comprising:

(a) means for providing an input signal in floating-point format; and (b) means for converting the input signal in floating-point format into an output signal in integer format, wherein means (b) invokes an integer comparison instruction of the processor to determine whether the input signal is larger than a second signal in floating-point format which is used as an input to the integer comparison instruction.

7. The apparatus of claim 6, wherein the input signal is used as another input to the integer comparison instruction and the second signal is a first constant in floating-point format, wherein means (b):

(1) returns a second constant in integer format, if the input signal is larger than the first constant; and (2) invokes a floating-point-to-integer conversion instruction of the processor using the input signal as input to the floating-point-to-integer conversion instruction, if the input signal is not larger than the first constant.

8. The apparatus of claim 7, wherein:

the processor is an Intel® Pentium™ processor;

the integer comparison instruction is a CMP instruction;

the first constant is +32,767 in floating-point format;

the second constant is +32,767 in integer format; and the floating-point-to-integer conversion instruction is a FIST instruction.

9. The apparatus of claim 7, wherein the input signal is an audio signal and further comprising means for transmitting the output signal to audio hardware for further processing.

10. The apparatus of claim 6, wherein means (b):

(1) generates the absolute value of the input signal in floating-point format;

(2) invokes the integer comparison instruction, wherein a first signal in floating-point format equal to the absolute value of the input signal in floating-point format is used as another input to the integer comparison instruction and the second signal is a first constant in floating-point format;

(3) determines whether the input signal is too high or low, if the absolute value of the input signal is larger than the first constant;

(4) returns a second constant in integer format, if the input signal is too high;

(5) returns a third constant in integer format, if the input signal is too low; and (6) invokes a floating-point-to-integer conversion instruction of the processor using the input signal as input to the floating-point-to-integer conversion instruction, if the absolute value of the input signal is not larger than the first constant.

11. The apparatus of claim 10, wherein:

the processor is an Intel® Pentium™ processor;

means (b) masks the input signal to generate the absolute value of the input signal;

the integer comparison instruction is a CMP instruction;

the first constant is +32,767 in floating-point format;

the second constant is +32,767 in integer format;

the third constant is −32,768 in integer format; and the floating-point-to-integer conversion instruction is a FIST instruction.

12. The apparatus of claim 10, wherein the input signal is an audio signal and further comprising means for transmitting the output signal to audio hardware for further processing.

13. The apparatus of claim 6, wherein the input signal is an audio signal and further comprising means for transmitting the output signal to audio hardware for further processing.

14. A storage medium having stored thereon a plurality of instructions for processing signals using a processor, wherein the plurality of instructions when executed by a processor, cause the processor to perform the steps of:

(a) providing an input signal in floating-point format; and (b) converting the input signal in floating-point format into an output signal in integer format, wherein step (b) comprises the step of invoking an integer comparison instruction of the processor to determine whether the input signal is larger than a second signal in floating-point format which is used as an input to the integer comparison instruction.

15. The storage medium of claim 14, wherein the input signal is used as another input to the integer comparison instruction and the second signal is a first constant in floating-point format, wherein step (b) comprises the steps of:

(1) returning a second constant in integer format, if the input signal is larger than the first constant; and (2) invoking a floating-point-to-integer conversion instruction of the processor using the input signal as input to the floating-point-to-integer conversion instruction, if the input signal is not larger than the first constant.

16. The storage medium of claim 15, wherein:

the processor is an Intel® Pentium™ processor;

the integer comparison instruction is a CMP instruction;

the first constant is +32,767 in floating-point format;

the second constant is +32,767 in integer format; and the floating-point-to-integer conversion instruction is a FIST instruction.

17. The storage medium of claim 15, wherein the input signal is an audio signal, wherein the plurality of instructions cause the processor to perform the further step of transmitting the output signal to audio hardware for further processing.

18. The storage medium of claim 14, wherein step (b) comprises the steps of:

(1) generating the absolute value of the input signal in floating-point format;

(2) invoking the integer comparison instruction, wherein a first signal in floating-point format equal to the absolute value of the input signal in floating-point format is used as another input to the integer comparison instruction and the second signal is a first constant in floating-point format;

(3) determining whether the input signal is too high or low, if the absolute value of the input signal is larger than the first constant;

(4) returning a second constant in integer format, if the input signal is too high;

(5) returning a third constant in integer format, if the input signal is too low; and (6) invoking a floating-point-to-integer conversion instruction of the processor using the input signal as input to the floating-point-to-integer conversion instruction, if the absolute value of the input signal is not larger than the first constant.

19. The storage medium of claim 18, wherein:

the processor is an Intel® Pentium™ processor;

step (b)(1) comprises the step of masking the input signal to generate the absolute value of the input signal;

the integer comparison instruction is a CMP instruction;

the first constant is +32,767 in floating-point format;

the second constant is +32,767 in integer format;

the third constant is −32,768 in integer format; and the floating-point-to-integer conversion instruction is a FIST instruction.

20. The storage medium of claim 18, wherein the input signal is an audio signal and further comprising means for causing the computer to transmit the output signal to audio hardware for further processing.

21. The storage medium of claim 14, wherein the input signal is an audio signal, wherein the plurality of instructions cause the processor to perform the further step of transmitting the output signal to audio hardware for further processing.

* * * * *